United States Patent [19]

Ohta et al.

[11] Patent Number: 5,376,215

[45] Date of Patent: Dec. 27, 1994

[54] APPARATUS FOR PRODUCTION OF EXTREMELY THIN SOI FILM SUBSTRATE

[75] Inventors: Yutaka Ohta; Masatake Nakano; Masatake Katayama; Takao Abe, all of Gunma, Japan

[73] Assignee: Shin-Etsu Handotai Co., Ltd., Tokyo, Japan

[21] Appl. No.: 151,209

[22] Filed: Nov. 12, 1993

Related U.S. Application Data

[62] Division of Ser. No. 873,751, Apr. 27, 1992.

[30] Foreign Application Priority Data

Apr. 27, 1991 [JP] Japan .................. 3-124779

[51] Int. Cl.$^5$ .................. B44C 1/22; H01L 21/306; C03C 15/00
[52] U.S. Cl. .................. 156/345; 156/626; 156/643
[58] Field of Search .............. 156/601, 626, 630, 643, 156/657, 662, 345, DIG. 111; 356/381; 219/121.68, 121.69

[56] References Cited

U.S. PATENT DOCUMENTS 5,091,320  2/1992  Aspnes et al. .................. 156/601 X
5,223,080  6/1993  Ohta et al. .................. 156/626

Primary Examiner—William Powell
Attorney, Agent, or Firm—Ronald R. Snider

[57] ABSTRACT

A method and apparatus for uniformizing a bonded SOI (silicon on insulator) thin film layer by the reaction of chemical vapor-phase corrosion excited by the ultraviolet light, which effect the measurement of film thickness efficiently and conveniently and consequently attaining highly accurate control of the dispersion of thickness of the thin film layer without requiring the substrate to be removed from the reaction vessel for chemical vapor-phase corrosion on each occasion of the measurement or necessitating installation of a mechanism for alteration of the position of measurement inside or outside the reaction vessel are disclosed. The measurement of film thickness is carried out by keeping observation of interference fringes due to distribution of thickness of the film layer.

3 Claims, 4 Drawing Sheets

APPARATUS FOR PRODUCTION OF EXTREMELY THIN SOI FILM SUBSTRATE

This is a division of application Ser. No. 07/873,751 filed Apr. 27, 1992, (pending).

BACKGROUND OF THE INVENTION

1. Field of the Invention

This invention relates to a method for the production of an extremely thin film layer of single crystal in a SOI (silicon on insulator) substrate and more particularly to a method for thinning to extremity a single crystal silicon layer bonded to the upper surface of a dielectric substrate and a method for controlling the thickness of the film layer.

2. Description of the Prior Art

As measures to obtain such an extremely thin film layer of single crystal silicon on a dielectric substrate as described above, the following methods have been proposed to date. A first method is the so-called SOS (silicon on sapphire) method which comprises effecting epitaxial growth of a thin film layer of single crystal silicon on a dielectric substrate such as, for example, a single crystal sapphire substrate.

A second method is the so-called SIMOX (separation by implantation oxygen) method which comprises implanting oxygen ions in a single crystal silicon substrate by the use of an ion implanting device and then annealing the oxygen ion-implanted substrate thereby forming an oxide film layer in a part of a prescribed depth within the single crystal silicon substrate.

A third method is the so-called ZMR (zone melting recrystallization) method which comprises forming a thermal oxide film on the surface of a single crystal silicon substrate, then coating the thermal oxide film with a polycrystalline or amorphous silicon film, irradiating the silicon film surface in strips in a direction with an energy beam such as, for example, an electron beam or a laser beam and, at the same time, moving the direction of the irradiation at the right angle thereby melting and solidifying the silicon film and converting the silicon film into a single crystal film throughout the entire surface of the substrate. Though these methods are useful as ways to obtain a thin film layer of single crystal silicon on a dielectric substrate, they invariably have a drawback that the thin film layers of single crystal silicon produced thereby copiously contain crystallographic defects (T. D. Stanley and P. K. Vasudev, Solid State Technology, November 1990, p. 58).

A fourth method is the bonded SOI method. The substrate of the bonded SOI configuration is obtained by preparing two single crystal silicon wafers subjecting at least one of the wafers to an oxidizing treatment thereby forming a silicon oxide film on the surface of the wafer subjected to the oxidizing treatment, superposing the two single crystal silicon wafers one on top of the other in such a manner as to interpose the oxide film between the superposed wafers, subsequently heating the superposed wafers to a prescribed temperature enough to induce bonding thereof, and polishing the wafer on the upper side thereby effecting required thinning. This method, by far, excels the other three methods cited above in respect that the thin film layer of single crystal silicon in the bonded SOI configuration has resulted from polishing a single crystal silicon wafer and, therefore, equals the wafer yet to be polished for thinning in crystallinity. By the technical standard currently available, the production of a thin film layer of uniform thickness not exceeding 1 μm is very difficult on account of accuracy of thinning by polishing.

The SOI configuration incorporating therein a very thin film of single crystal silicon of not more than 500 nm has been attracting attention as a product promising to find utility in finely designed high-speed CMOS IC's. Particularly, the 1G DRAM needs to use the SOI configuration incorporating therein an extremely thin layer of single crystal silicon 100 nm in thickness. Such an extremely thin film layer mentioned above is required to be formed with the thickness thereof controlled so accurately that the fluctuation of thickness may be within ±10% of the average thickness. This is because the fluctuation of thickness in the extremely thin single crystal silicon layer has a serious effect of degrading the electrical characteristics of the component elements formed in the layer in terms of uniformity.

The fluctuation of thickness of the thin film layer of single crystal silicon of the bonded SOI configuration attainable by the current thickness controllability of polishing is within ±0.3 μm at most over a wafer of a diameter of 150 mm. The best improvement expected to be achieved in near future will be on the order of ±0.1 μm. In the case that the average thickness of the thin film of single crystal in the SOI silicon substrate attainable by the current level of polishing is 0.50 μm, it is only fair to consider that this thin film layer has the largest thickness of about 0.80 μm and the smallest thickness of about 0.20 μm. The difference, 0.60 μm, in this case exceeds the average thickness.

An attempt to produce an SOI substrate incorporating therein a thin film layer of single crystal silicon having an average thickness of not more than 0.30 μm may possibly result in complete loss of part of the thin film of single crystal in the course of the work of polishing.

Our previous invention relating to a method for uniformizing the thickness of a thin film of single crystal silicon in the bonded SOI configuration by the use of the action of chemical vapor-phase corrosion excited by the ultraviolet light was already filed for patent. This previous invention aims to attain highly accurate control of the fluctuation of thickness of the thin film layer of the bonded SOI configuration by fictitiously in the memories of a computer system or something like that dividing the surface of the thin film into minute sections of a prescribed area, measuring the thickness of the thin film layer of single crystal silicon in each of the minute sections in advance of the chemical vapor-phase corrosion, placing the thin film layer in an atmosphere of chlorine, fluorine or the compounds thereof as the reactant gas for the reaction of corrosion, irradiating the minute sections of the surface with the doses of the ultraviolet light from a lamp or an excimer laser as the light source respectively adjusted so that the thin film layer of single crystal silicon acquires a single equal thickness in all the minute sections after completion of the chemical vapor-phase corrosion, causing the ultraviolet light to decompose fluorine or chlorine molecules or the compounds thereof thereby inducing generation of active species of fluorine or chlorine radicals or molecules containing such atoms which are capable of exerting the action of a chemical vapor-phase corrosion on silicon, and consequently effecting required thinning of the single crystal silicon layer by the reaction of chemical vapor-phase corrosion. In the actual uniformization of the thin film layer of single crystal silicon, the uniformity of thickness of the thinned film layer can be enhanced by repeating several times the measurement of the thickness of thin film layer in the imaginary divided minute sections and the reaction of chemical vapor-phase corrosion.

The methods available for the measurement of thickness of the thin film layer of single crystal silicon are broadly divided under two types. A first method carries out the measurement in a wafer which has been taken out from the vessel used for the reaction of chemical vapor-phase corrosion. This method allows use of just about any instrument available for the measurement of the thickness of the thin film layer of single crystal silicon on a silicon oxide film. It also allows freedom of choice between moving the instrument and moving the substrate itself in altering the position of measurement to a multiplicity of points on the substrate.

Moreover, the technique capable of performing this measurement at a rate of even less than 1 second per point of measurement has been already realized. Thus, this method enjoys merits in point of versatility and expeditiousness of measurement. Since this method necessitates taking out of the substrate from the vessel for the reaction of chemical vapor-phase corrosion, it entails the disadvantage that the inevitable displacement of the entrapped gas in the reaction vessel consumes time.

A second method performs the measurement of the thickness of the film layer of single crystal silicon on the substrate, with the substrate left standing within the vessel for the reaction of chemical vapor-phase corrosion. While this method has an advantage of obtaining the measurement without requiring taking out of the substrate from the reaction vessel, still it has a disadvantage that the use of the measuring instrument outside the reaction vessel results in an inevitable elongation of the distance of measurement between the sensor and the sample and the movement of the measuring instrument or that of the substrate required for the alteration of the position of measurement is liable to jeopardize the accuracy of measurement. When a mechanism for moving the substrate is installed within the reaction vessel or the measuring instrument is accommodated in the reaction vessel for the sake of this method, another disadvantage arises that the apparatus gains unduly in size and complexity.

SUMMARY OF THE INVENTION

This invention aims to solve the problems encountered by the prior art as described above and has as an object thereof the provision of a method and apparatus for uniformizing a bonded SOI thin film layer by the reaction of chemical vapor-phase corrosion excited by the ultraviolet light, which effect the measurement of film thickness efficiently and conveniently and consequently attaining highly accurate control of the fluctuation of thickness of the thin film without requiring the substrate to be removed from the reaction vessel for chemical vapor-phase corrosion on each occasion of the measurement or necessitating installation of a mechanism for alteration of the position of measurement inside or outside the reaction vessel.

To accomplish the object described above according to this invention, there is provided a method for the production of a SOI (silicon on insulator) substrate having an extremely thin film of single crystal silicon bonded to the upper surface of a dielectric substrate, which method is characterized by irradiating the thin film layer of single crystal of the SOI substrate prepared deliberately in small thickness with a visible light and meanwhile keeping observation on the consequently manifesting group of interference fringes due to distribution of thickness of the thin film layer selectively thinning only the region in the group of interference fringes which is encircled by the interference fringes corresponding to the largest film thickness by the action of a chemical vapor-phase corrosion excited by the ultraviolet light until the interference fringes in the selected region disappear, then effecting the selective thinning similarly in the region encircled by the interference fringes corresponding to the newly largest film thickness after the disappearance of the interference fringes until the interference fringes in the selected region disappear, and repeating this procedure until all the interference fringes appearing on the thin film layer on the substrate cease to exist thereby effecting thorough thinning of the thin film on the substrate and, at the same time, producing a highly accurate control of the fluctuation of thickness of the thin film layer.

Then, the apparatus for production according to this invention is characterized by comprising visible light emitting means, interference fringe group observing means for observing the group of interference fringes manifested owing to distribution of thickness in the thin film layer of single crystal of the SOI substrate when the thin film layer of single crystal is irradiated with the visible light from the visible light emitting means, a light source for the ultraviolet light, light path varying means for varying the light path of the ultraviolet light in accordance with the change in the position of irradiation, an optical lens system for converging the flux of the ultraviolet light, control means for selecting the region in the group of interference fringes which is encircled by the interference fringes corresponding to the largest film thickness and, at the same time, controlling the optical lens system thereby varying the position of irradiation with the flux of the ultraviolet light, and supply means for supplying a chemical species for producing the chemical vapor-phase corrosion excited by the ultraviolet light. When the thin film layer of single crystal is irradiated with the visible light from the visible light emitting means, a light source for the ultraviolet light, light path varying means for varying the light path of the ultraviolet light in accordance with the change in the position of irradiation, an optical lens system for converging the flux of the ultraviolet light, control means for selecting the region in the group of interference fringes which is encircled by the interference fringes corresponding to the largest film thickness and, at the same time, controlling the optical lens system thereby varying the position of irradiation with the flux of the ultraviolet light, and supply means for supplying a chemical seed for producing an action of chemical vapor-phase corrosion excited by the ultraviolet light.

DETAILED DESCRIPTION OF THE INVENTION

Figure 1:
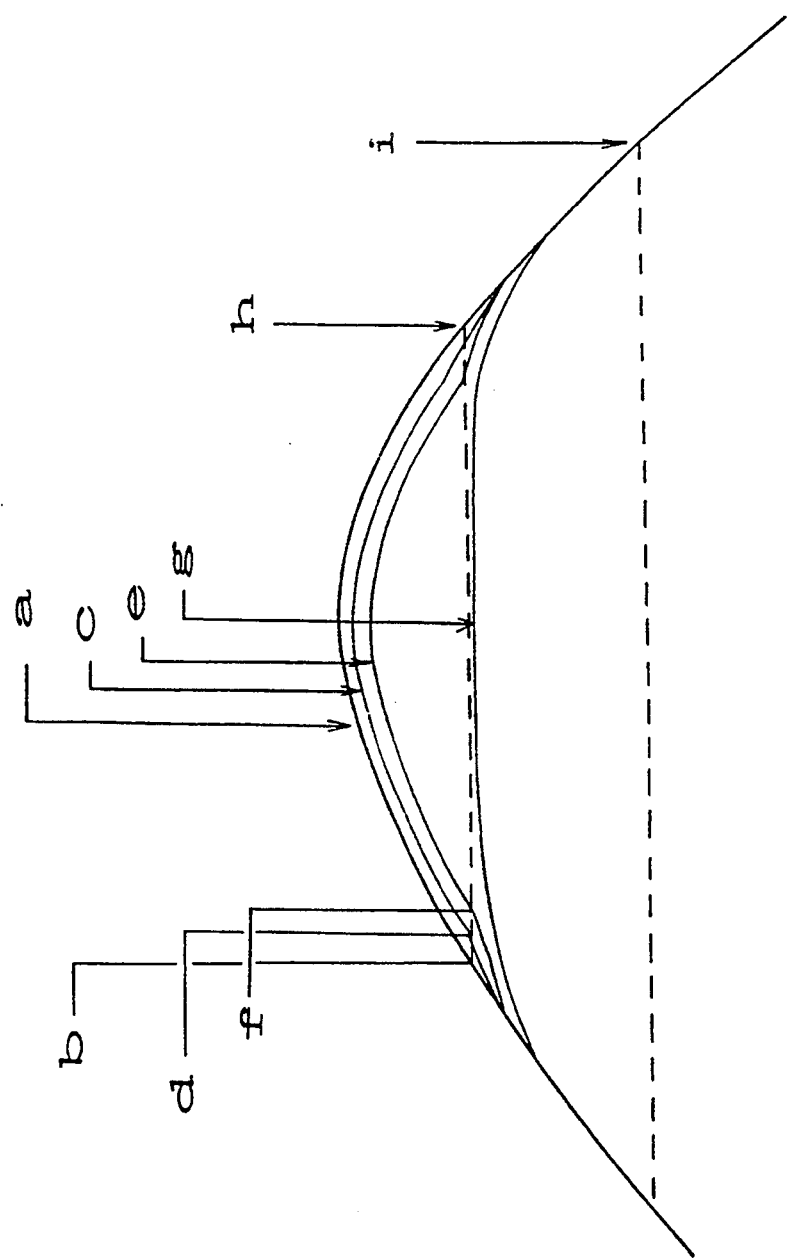
FIG. 1 is an explanatory diagram illustrating the shift of position of interference fringes in consequence of the reaction of chemical vapor-phase corrosion.

Now, this invention will be described in detail below.

When a bonded SOI substrate is irradiated with a visible light, it generates a group of optical interference fringes consisting of dark line parts and bright line parts according to the dispersion of thickness of the thin film of single crystal silicon. For the sake of convenience, the dark line parts will be referred to as "interference fringes" and the pattern formed of the dark line parts as "a group of interference fringes" hereinafter.

The group of interference fringes constitutes itself an ideal index of the fluctuation of thickness of the thin film layer of single crystal silicon. The local difference of thickness of the thin film layer of single crystal silicon shown by two adjacent interference fringes varies with the wavelength of the light used for the irradiation. The difference is about 45 nm when the irradiation uses a blue light having a wavelength of 440 nm and about 80 nm when the irradiation uses a red light having a wavelength of 640 nm, for example.

When only the region in the group of interference fringes which is encircled by fringes corresponding to the largest film thickness (hereinafter referred to as "interference fringes of the highest order") is irradiated with the ultraviolet light, this region selectively undergoes the action of chemical vapor-phase corrosion.

When the irradiation of this region with the ultraviolet light is so performed that the dose of the ultraviolet light per unit area is uniform throughout the entire surface used for the irradiation, this region is uniformly corroded and, as a result, the interference fringes of the highest order are slightly shifted inwardly.

When this procedure is repeated, the region encircled by the interference fringes of the highest order eventually ceases to exist and the region encircled by the interference fringes of the highest order before the start of the reaction of corrosion is wholly merged into part of the region encircled by interference fringes of the next highest order.

Then, the interference fringes of the next highest order is put out of existence by performing the selective action of chemical vapor-phase corrosion similarly in the region encircled by the interference fringes of the next highest order. By repeating this procedure until the interference fringes cease to exist on the substrate, the fluctuation of thickness of the thin film on the substrate can be reduced below the interval between the interference fringes.

To be more strict, the method described above transforms the entire surface of the substrate into one bright line part. Since the bright line part is generally about ⅔ to ¾ of the interval between the interference fringes, the fluctuation of thickness of the thin film layer is brought to a size of ⅔ to ¾ of the interval between the interference fringes. Under a blue light having a wavelength of 440 nm, this fluctuation equals ±15 to 17 nm.

At least two methods are conceivable for developing the method described above and further diminishing the fluctuation. One method comprises subjecting the entire surface of the substrate which has been transformed into one bright line part to uniform chemical vapor-phase corrosion thereby inducing generation of interference fringes or dark line parts, and selectively subjecting the region of bright line parts to chemical vapor-phase corrosion thereby transforming the entire surface of the substrate into a dark line part. The fluctuation of thickness of the thin film layer which is obtained by this method equals ±6 to 8 nm under a blue light having a wavelength of 440 nm.

The other method comprises slightly varying the wavelength of the light used for irradiation after the entire surface of the substrate has been transformed into one blight line part thereby intentionally inducing generation of a dark line part on the substrate. When the entire surface of the substrate is transformed by the slight variation of wavelength into one dark line part, the fluctuation of thickness of the thin film equals about ±6 to 8 nm similarly to that obtained in the previous case under a blue light having a wavelength of about 440 nm.

If the slight variation of the wavelength of the light used for the irradiation fails to transform the entire surface of the substrate into one dark line part and compels the surface of the substrate to suffer persistent coexistence of both a dark line part and a blight line part, desired extinction of the dark line part is attained by adjusting the wavelength of the light for irradiation so as to give a larger thickness to the dark line part than the bright line part, selectively subjecting the region of the dark line part to chemical vapor-phase corrosion, and decreasing the thickness of the thin film layer in this region.

The procedure described above is continued until the slight variation of the wavelength of the light used for irradiation transforms the entire surface of the substrate into one dark line part. As a result, the fluctuation of thickness of the thin film layer equals about ±6 to 8 nm substantially similarly to that obtained in the previous case under a blue light having a wavelength in the neighborhood of 440 nm.

Conversely, when the dispersion of thickness of the thin film layer of single crystal silicon is allowed to be larger, as when the allowed fluctuation of thickness is larger than the difference of thickness of the thin film layer indicated by n interference fringes, for example, the reaction of chemical vapor-phase corrosion may be discontinued to terminate the procedure at the time that the number of interference fringes still remaining decreases to n at most.

The substrate on which the action of corrosion is started is a bonded silicon wafers of the SOI configuration. This single crystal silicon layer is desired to be polished until the thickness thereof is uniformized to a large extent before it is put to use in this invention.

For the production of an SOI whose single crystal silicon layer has been thinned to the range of 0.10 ±0.01 μm, for example, a bonded pair of wafers of the SOI configuration which has been polished by the current technique until the thickness of the thinnest part falls in the range of 0.40 ±0.30 μm, a value larger than the target thickness may be desirably used as the starting substrate.

It is allowable to use as the starting substrate a bonded pair of wafers which has been thinned by the action of liquid-phase or gaseous-phase corrosion. The bonded pair of wafers obtained by the technique currently available for the corrosion under discussion is inferior in point of accuracy of film thickness distribution to the bonded pair of wafers obtained by polishing. This bonded pair of wafers, therefore, entails the disadvantage that the time required for thinning the film layer by the reaction of chemical vapor-phase corrosion is proportionately lengthened.

For the production of an SOI whose single crystal silicon film layer has been extremely thinned to the range of 0.10 ±0.01 μm, a bonded pair of wafers of the SOI configuration which has been extremely thinned to the order of 0.45 ±0.30 μm or to a larger median may be used as the starting substrate. In this case, the thickness of the thin film layer of single crystal silicon can be finally decreased to the range of 0.10 ±0.01 μm by controlling the fluctuation of film thickness by the action of chemical vapor-phase corrosion according to this invention within ±0.01 μm, subjecting the entire surface of the thin film to thermal oxidation, or subsequently removing the oxide film, or uniformly thinning the thin film by dry etching the entire surface thereof.

When a light having a wavelength of λ is projected on a bonded SOI thin film at an angle of θ relative to the normal line to the surface of the thin film layer, part of this light is reflected by the surface of the thin film and the remainder of the light is passed the thin film, reflected by the boundary surface between the thin film layer and the bound oxide film, and sent out the thin film layer. By the optics, the difference between the paths of these two beams of light is found to be $2d \cos\theta$, wherein d stands for the thickness of the thin film and θ for the angle of incidence of the light in the thin film. The wavelength of the light in the thin film is expressed by $\lambda/n(\lambda)$, wherein $n(\lambda)$ stands for the index of refraction of the single crystal silicon relative to the light of a wavelength in a vacuum. The condition for producing increased brightness and that for producing increased darkness in consequence of the interference of these two beams of light are as follows.

Condition for increased brightness (bright line part):

$$2d \cos \psi = (m - \tfrac{1}{2}) \cdot \lambda/n(\lambda) \qquad \text{(Formula 1)}$$

Condition for increased darkness (dark line part):

$$2d \cos \psi = m \cdot \lambda/n(\lambda) \qquad \text{(Formula 2)}$$

Here, m stands for an arbitrary natural number. The reason for the deduction of ½ in the condition for producing increased brightness is that the beam of light reflected by the boundary surface between the thin film layer and the bound oxide film layer encounters no deviation of phase, whereas the beam of light reflected by the surface of the thin film experiences a deviation, π, of phase.

The equation $\psi = 0$ is satisfied when a light having a wavelength of λ is projected perpendicularly, namely with the angle of incidence, θ, set at 0, on the bonded SOI thin film layer to irradiate the entire surface of the thin film layer. In accordance with Formula 2, therefore, a dark line part, which will be referred to simply as "an interference fringe" here, is produced each time the distance of the surface of the thin film layer from the oxide film reaches a multiple of $\lambda/2n(\lambda)$. To be more exact, in a fictitious constant-height surface which is at a distance of $m \cdot \lambda/2n(\lambda)$ from the oxide film, an interference fringe of the m'th order will occur at the point of intersection between this fictitious surface and the surface of the thin film layer. Let $h_{max}$ and $h_{min}$ stand respectively for the maximum and minimum values of the film layer thickness and the following formulas stand for the ranges allowed for $m_{max}$ and $m_{min}$ respectively, $$m_{max} < 2h_{max} \cdot n(\lambda)/\lambda < m_{max} = 1 \qquad \text{(Formula 3)}$$

$$m_{min} - 1 < 2h_{min} \cdot n(\lambda)/\lambda < m_{min} \qquad \text{(Formula 4)}$$

and a group of $(m_{max} - m_{min} + 1)$ kinds of interference fringes between the $m_{max}$'th order and the $m_{min}$'th order will be produced on the surface of the thin film layer.

In finding the interference fringes of the highest order in the group of interference fringes, it is necessary also to know the direction in which the order of interference fringes increases throughout the entire surface of the thin film layer. In other words, it is necessary to discern which of each two adjacent interference fringes in the group of interference fringes is higher in order. At least two measures are conceivable for the discrimination of superiority in order between the two adjacent interference fringes.

The first measure consists in comparing by visual observation the magnitudes of luminance in the parts of the opposite edges of the interference fringes in which the luminance culminate. The beams of light reflected from these parts are products of synthesis of the beams of light which have been passed through the thin film layer and then reflected by the boundary surface and the beams of light which share the same phase therewith and have been reflected by the surface of the bonded SOI film layer.

Since a visible light which has impinged on a thin film layer is absorbed by silicon and the intensity of this visible light exponentially decreases in proportion as the distance of travel of light in the layer of silicon increases, the intensity of the synthetic beams of light mentioned diminishes with the increasing thickness of the thin film layer.

By comparing the magnitudes of luminance in the bright parts of the opposite edges of each interference fringe, therefore, which side is larger in film layer thickness between the opposite sides of interference fringes can be detected and, as a result, the direction in which the order of interference fringes increases can be found out.

The second measures resides in observing the movement of the group of interference fringes with the aid of two beams of light having different wavelengths. A group of interference fringes is produced from one of incident wavelength. When this incident wavelength is slightly shifted toward a higher wavelength or a lower wavelength, the group of interference fringes is moved according to the shift of the incident wavelength. When the incident wavelength is shifted toward a higher wavelength, the interference fringes are moved in the direction in which the magnitude of order increases. Conversely when the incident wavelength is shifted toward a lower wavelength, the interference fringes are moved in the direction in which the magnitude of order decreases. The movement of the group of interference fringes in consequence of the shift of the wavelength, therefore, enables one to tell the direction in which the magnitude of order of interference fringes is increased.

The movement of interference fringes caused by the reaction of chemical vapor-phase corrosion will be described below with reference to FIG. 1. In FIG. 1, a stands for the surface of a film layer before chemical vapor-phase corrosion, b for the position of the interference fringe of the highest order before chemical vapor-phase corrosion, c for the surface of the film layer after the first reaction of chemical vapor-phase corrosion, d for the position of the interference fringe of the highest order after the first reaction of chemical vapor-phase corrosion, e for the surface of the film layer after the second reaction of chemical vapor-phase corrosion, f for the position of the interference fringe of the highest order after the second reaction of chemical vapor-phase corrosion, g for the surface of the film layer after extinction of the interference fringe of the highest order, h for the constant-height surface of generation of interference fringe of the highest order, and i for the constant-height surface of generation of interference fringe of the second highest order.

When the ultraviolet light is projected only in the region of the bonded SOI thin film layer encircled by interference fringes of the highest order in such a manner that the dose of the light per unit area is uniformized throughout the region, this region is uniformly corroded (by the first reaction of chemical vapor-phase corrosion) as shown in FIG. 1, with the result that the interference fringes of the highest order are moved toward the inside.

When the irradiation with the ultraviolet light is similarly effected selectively in the region encircled by the interference fringes of the highest order existent after the movement to induce the second reaction of chemical vapor-phase corrosion, the interference fringes are moved further toward the inside.

When this procedure is repeated until the region encircled by interference fringes of the highest order ceases to exist the region encircled by the interference fringes of the highest order before the start of the corrosion is wholly transformed into a region encircled by the interference fringes of the next highest order.

Subsequently, the selective action of chemical vapor-phase corrosion is similarly performed in the region encircled by interference fringes of the next highest order. The fluctuation of thickness of the thin film layer on the substrate can be controlled to magnitude smaller than the interval between interference fringes by repeating the procedure described above until the interference fringes on the substrate cease to exist.

The ultraviolet light emitted from a lamp or an excimer laser, by virtue of the photon energy of itself, causes dissociation of fluorine or chlorine molecules or molecular bonds of their compounds and consequently gives rise to radical species and accelerates the activation of molecules. The radical species and molecules which have been caused to assume an unsteady state as described above veritably abound in reactivity and enable corrosion of the silicon surface due to the reaction of chemical vapor-phase corrosion.

Since these radical species and activated molecules occur exclusively in the flux of the ultraviolet light and are deprived of energy outside their mean free paths, the selective corrosion takes place only in the part of the bonded silicon wafer exposed to the ultraviolet light. The occurrence of the corrosion inevitably occurs to an extremely slight extent in the region very closely approximating the part of the bonded silicon wafer exposed to the ultraviolet light. This detriment ironically brings about the advantage that the part exposed to the ultraviolet light (the part subjected to the reaction of chemical vapor-phase corrosion) and the immediate vicinity thereof are smoothly continued into each other without giving rise to a clear difference in level when an ample stock is allowed for the etching per round of the reaction of chemical vapor-phase corrosion.

When the extinction of the interference fringes of the highest order is attained by several rounds of the action of chemical vapor-phase corrosion, the region encircled by the interference fringes of the former highest order and the region encircled by the interference fringes of the next highest order are smoothly continued into each other.

Finally, since the corrosion effected herein has no use for charged particles of high energy, it is incapable of inflicting upon the crystal substrate such damages as dielectric breakdown which are encountered as in the reactive plasma etching and is hardly capable of causing deterioration of crystallinity to the thin film layer or the substrate.

PREFERRED EMBODIMENT OF THE INVENTION:

Now, a method and apparatus embodying this invention in the production of an extremely thin SOI film layer substrate in an SOI substrate will be described in detail below.

Figure 3:
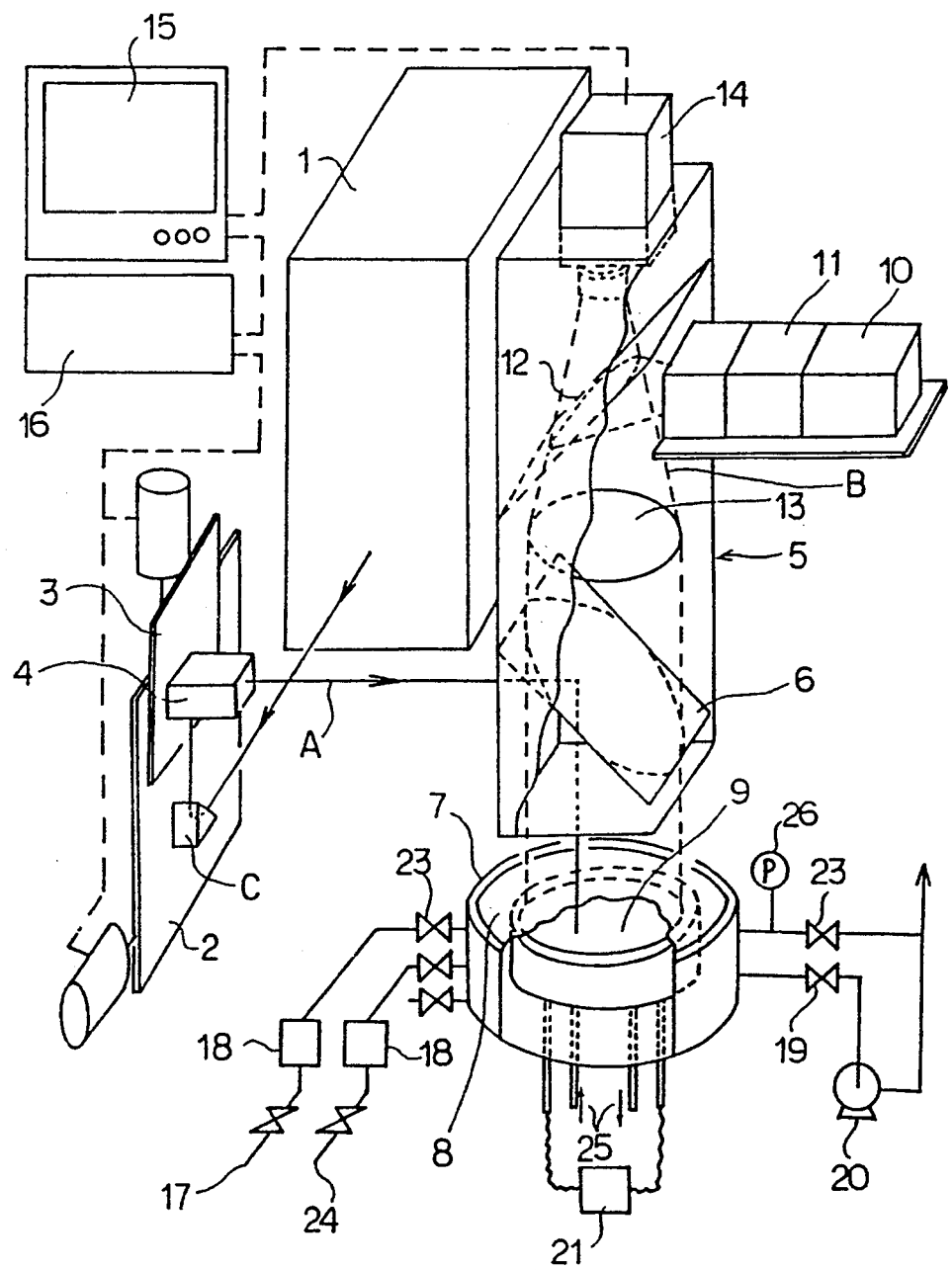
FIG. 3 is a schematic structural diagram illustrating an apparatus of this invention for the production of an extremely thin SOI film substrate.

FIG. 3 schematically illustrates the apparatus embodying this invention. As a light source 1 for ultraviolet light, a mercury-xenon lamp of 50 W was used. The ultraviolet light having wavelengths of 200 to 320 nm was passed through an optical filter and rectified in a form substantially approximating a collimated beam via an electromagnetic shutter. The path of this ultraviolet light was changed as required by means of optical mirrors on an X-axis movable table 2 and a Z-axis movable table 3 and the flux of this ultraviolet light was converged by an optical lens system 4 on the Z-axis table.

The light path was turned downwardly at a right angle by an ultraviolet light reflecting mirror 6 disposed inside a substrate monitor device 5. The ultraviolet light was then passed through a quartz window 8 in a sample chamber 7 and allowed to impinge on substrate 9. The optical lens system 4 was so adapted as to give a circular cross section 5 mm in diameter to the impinging light flux on the substrate.

The energy of the light flux on the substrate was 300 mW/cm$^2$. The condition of progress of the reaction of chemical vapor-phase corrosion on the substrate was monitored by passing the light from a halogen lamp 10 through a monochromator 11 thereby producing a light flux 440 nm ±5 nm in diameter, causing this visible light to be reflected by a half mirror 12 and then passed through the ultraviolet light reflecting mirror 6, then allowing the light to pass the quartz window 8 in the sample chamber 7 and impinge on the substrate 9, causing the reflected light to advance reversely through the same path except for penetration through the half mirror 12, condensing the light by the use of an optical system 13, and observing the condensed beam of light with the aid of a CCD camera 14. A computer 16 for the analysis of images is connected to a display 15 of the CCD camera so that the position of the group of interference fringes (dark part) on the substrate was stored in a memory. The computer was designed to calculate and store in the memory the direction in which the magnitudes of order of interference fringes in the group of interference fringes produced by the visible light of 440 nm ±5 nm were increased by comparing the position of the group of interference fringes mentioned above with the position of the group of interference fringes produced when the wavelength of the visible light was changed by the monochromator 11 to 540 nm ±5 nm or 640 nm ±5 nm.

The computer 16 discerned the interference fringe of the highest order on the basis of the data accumulated in the memory, selected the region encircled by the relevant interference fringes, issued competent instructions to the X-axis movable table 2, the Z-axis movable table 3, and the electromagnetic shutter of the ultraviolet light source 1, and caused the flux of ultraviolet light to impinge uniformly on the region by virtue of X-Z axis scanning (X-Y scanning on the substrate).

The sample chamber 7 was made of stainless steel. Into this sample chamber 7, a $NF_3$ gas 17 supplied at a flow rate regulated to 300 cc/min by the use of a gas flow volume controller 18. The inner pressure of this chamber was maintained at $10^3$ Pa by joint use of a conductance valve 19 and a rotary pump 20. The substrate 9 was placed on a sample base 11 having the temperature thereof controlled to 150° C. by resistance heating effected by means of a temperature regulator 10.

Figure 2:
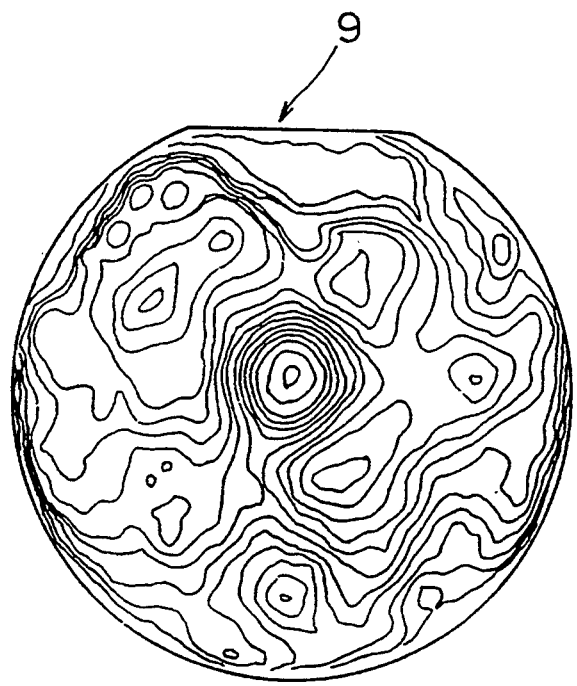
FIG. 2 is a sketch depicting a typical group of interference fringes appearing before the chemical vapor-phase corrosion.

The substrate 9 was obtained by bonding an n type $<100>10\Omega$ cm single crystal silicon wafer 150 mm in diameter through the medium of a thermal oxide film 0.60 $\mu$m in thickness to an n type $<100>1 \Omega$ cm single crystal silicon wafer 150 mm in diameter and 625 $\mu$m in thickness and then polishing the former single crystal silicon wafer to a thickness distribution having the smallest thickness of 0.366 $\mu$m and the largest thickness of 1.043 $\mu$m. The group of interference fringes produced on this substrate by a visible light of a wavelength of 440 nm ±5 nm before the start of the reaction of chemical vapor-phase corrosion is shown in FIG. 2.

Two adjacent interference fringes showed a difference of about 45 nm in thickness of the thin film. The reaction of chemical vapor-phase corrosion was initiated in a region encircled of interference fringes of the highest order.

By one round of the scanning of the region with the ultraviolet light, the thin film layer of single crystal silicon in the region was uniformly removed by corrosion in a thickness of 9 nm as a unit. With the aid of the display 15, the computer 16 was enabled to confirm the movement of the interference fringes of the highest order each time the corrosion by the unit thickness of 9 nm was completed and effect automatic change of the range of ultraviolet light scanning so that the next round of the chemical vapor-phase corrosion would take place in the region encircled by the relevant interference fringes after the movement of the group of interference fringes mentioned above.

Figure 4:
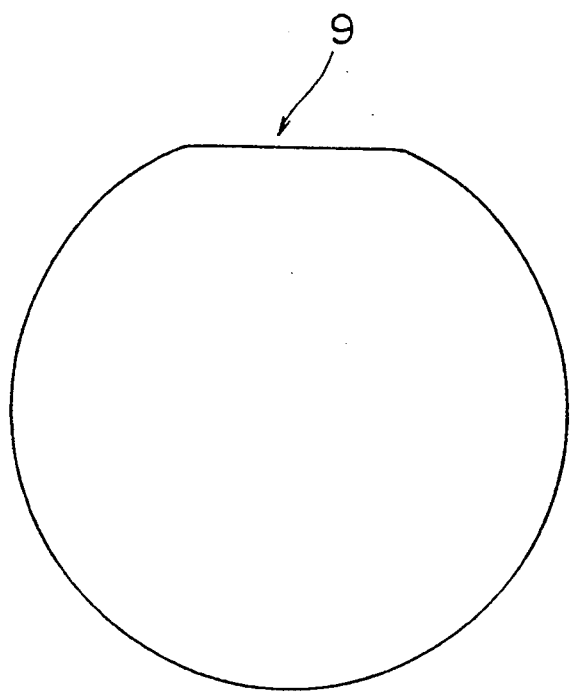
FIG. 4 is a sketch depicting the fact that the extremely thin SOI film substrate obtained by embodying this invention is incapable of producing an interference fringe.

Since the interference fringes of the new highest order were actually put out by two rounds of scanning, the computer 16 automatically selected the interference fringes of the next highest order as the subject of manipulation and issued the same instructions. In this manner, the extinction of the interference fringes of the next highest order was obtained by a total of five rounds of ultraviolet light scanning. By repeating the procedure described above, the inference fringes on the substrate 9 were wholly put out (FIG. 4).

When the wavelength of the light used for the irradiation was increased from the medial value of 440 $\mu$m by the use of the monochromator 11, a dark line part began to occur on the substrate. When the medial wavelength increased to 482 $\mu$m, the dark line part corresponded to the part of a large film thickness and the bright line part corresponded to the part of a small film thickness.

The region of the dark line part dwindled when the dark line part was exclusively scanned at a high rate with the ultraviolet light and the thin film layer of single crystal silicon in this region was removed uniformly by a unit thickness of 5 nm by the action of chemical vapor-phase corrosion. When this procedure was repeated once more, the region of the dark line part ceased to exist.

When the wavelength of the light for irradiation was changed to a medial value of 469 $\mu$m, the dark line part reappeared. The dark line part corresponded to the part of a large film thickness and the bright line part corresponded to the part of a small film thickness. This region of the dark line part ceased to exist when this region was similarly scanned at a high rate with the ultraviolet light and the thin film layer of single crystal silicon in this region was removed uniformly by corrosion in a unit thickness of 5 nm by the action of chemical vapor-phase corrosion.

When the medial wavelength of the light for irradiation was changed to 457 $\mu$m, the dark line part reappeared. The dark line part corresponded to the part of a large film thickness and the bright line part corresponded to the part of a small film thickness. Since the region of the bright line part was slight in size, the thinning of the thin film layer by the action of chemical vapor-phase corrosion was terminated. The chamber was vacuumized and then filled with air and opened to allow removal of the substrate. The thin film layer of single crystal silicon on the substrate, by measurement, was found to have an average thickness of 0.371 $\mu$m ±0.007 $\mu$m, with the minimum at 0.364 $\mu$m and the maximum at 0.378 $\mu$m.

When the thin film layer consequently obtained was subjected to pyrogenic oxidation at 1,100° C. for one hour to have a thermal oxide film formed thereon and this oxide film was removed with an aqueous hydrofluoric acid solution, there was obtained an extremely thin film layer of single crystal silicon having an average thickness of 0.108 $\mu$m ±0.008 $\mu$m. As a result, the fluctuation of thickness of the thin film layer was within ±10% of the target level.

As is clear from the description given above, in the uniformization of thickness of a bonded SOI thin film layer by the reaction of chemical vapor-phase corrosion excited by the ultraviolet light, this invention allows efficient and convenient measurement of the film thickness and permits highly accurate control of the fluctuation of thickness of the thin film without requiring the substrate to be removed from the vessel for the reaction of chemical vapor-phase corrosion for each occasion of the measurement of film thickness or requiring a mechanism for alteration of the position of measurement of the film thickness to be installed within the vessel for the reaction.

What is claimed is:

1. An apparatus for the production of an extremely thin SOI film substrate, having an extremely thin film layer of single crystal bonded to the upper surface of a dielectric substrate, characterized by comprising visible light emitting means, interference fringe group observing means for observing the group of interference fringes manifested owing to distribution of thickness in the thin film of single crystal of said SOI substrate when said thin film layer of single crystal is irradiated with the visible light from said visible light emitting means, a light source for ultraviolet light, light path varying means for varying the light path of said ultraviolt light in accordance with the change in the position of irradiation, an optical lens system for converging the flux of said ultraviolet light, control means for selecting the region in the group of interference fringes which is encircled by the interference fringes corresponding to the largest film thickness and, at the same time, controlling said optical lens system thereby varying the position of irradiation with the flux of said ultraviolet light, and supply means for supplying a chemical species for producing an action of chemical vapor-phase corrosion excited by the ultraviolet light.

2. An apparatus according to claim 1, wherein said region in said group of interference fringes which is enclosed by the interference fringes corresponding to the largest film thickness is selected by measuring the largest magnitudes of luminance of bright lines adjoining the opposite edges of interference fringes (dark lines) and comparing the magnitudes of luminance thereby identifying the interference fringes of the largest order.

3. An apparatus according to claim 1, wherein said region encircled by the interference fringes corresponding to the largest film thickness in the field of interference fringes is selected by optically detecting the direction in which said interference fringes shift their positions by using two beams of light having different wavelengths.

* * * * *